United States Patent
Carter et al.

(10) Patent No.: US 7,115,216 B2
(45) Date of Patent: Oct. 3, 2006

(54) SCREEN PRINTABLE ELECTROLUMINESCENT POLYMER INK

(75) Inventors: Susan A. Carter, Santa Cruz, CA (US); John G. Victor, Chicago, IL (US); Sara Tuttle, Santa Cruz, CA (US); Jane Breeden, Felton, CA (US)

(73) Assignee: Add-Vision, Inc., Scotts Valley, CA (US)

(*) Notice: Subject to any disclaimer, the term of this patent is extended or adjusted under 35 U.S.C. 154(b) by 159 days.

(21) Appl. No.: 10/327,628

(22) Filed: Dec. 20, 2002

(65) Prior Publication Data
US 2003/0151700 A1    Aug. 14, 2003

Related U.S. Application Data

(60) Provisional application No. 60/342,580, filed on Dec. 20, 2001.

(51) Int. Cl.
C09K 11/06    (2006.01)
C09K 11/02    (2006.01)

(52) U.S. Cl. .............................. 252/301.16; 252/301.34

(58) Field of Classification Search ........... 252/301.16, 252/301.35; 427/66, 157, 71, 73, 64, 68; 428/690, 917
See application file for complete search history.

(56) References Cited

U.S. PATENT DOCUMENTS

| 3,891,450 | A |   | 6/1975  | Trease ........................ 106/26 |
| 4,539,507 | A |   | 9/1985  | VanSlyke et al. |
| 4,665,342 | A |   | 5/1987  | Topp et al. |
| 4,710,401 | A | * | 12/1987 | Warren et al. ............... 427/121 |
| 4,882,517 | A |   | 11/1989 | Maruyama et al. |
| 4,885,211 | A |   | 12/1989 | Tang et al. |
| 5,247,190 | A |   | 9/1993  | Friend et al. |
| 5,281,489 | A |   | 1/1994  | Mori et al. |
| 5,408,109 | A |   | 4/1995  | Heeger et al. |
| 5,682,043 | A | * | 10/1997 | Pei et al. ...................... 257/40 |
| 5,817,430 | A |   | 10/1998 | Hsieh |
| 5,843,534 | A |   | 12/1998 | Chang et al. |

(Continued)

FOREIGN PATENT DOCUMENTS

EP    1 083 775    3/2001

(Continued)

OTHER PUBLICATIONS

Pardo et al., "Application of Screen Printing in the Fabrication of Organic Light-Emitting Devices," *Adv. Mater.* (2000) 12:1249-1252.

(Continued)

*Primary Examiner*—C. Melissa Koslow
(74) *Attorney, Agent, or Firm*—Pillsbury Winthrop Shaw Pittman LLP

(57) ABSTRACT

The addition of a variety of additives to a soluble electroluminescent polymer in solution is used to improve the printability and performance of screen printed light-emitting polymer-based devices. Examples of such additives include transparent polymers, gel-retarders, high viscosity liquids, organic and inorganic salts, and oxide nanoparticles. The additives are used to control the viscosity of the electroluminescent polymer ink, to decrease the solvent evaporation rate, and to improve the ink consistency and working time. In addition, these additives can improve the charge injection and power efficiency of light emitting devices manufactured from the screen printable electroluminescent polymer ink.

17 Claims, 2 Drawing Sheets

U.S. PATENT DOCUMENTS

| | | | |
|---|---|---|---|
| 5,876,865 | A | 3/1999 | Hsieh |
| 5,895,717 | A | 4/1999 | Cao et al. |
| 6,001,283 | A | 12/1999 | Chang et al. |
| 6,153,711 | A | 11/2000 | Towns et al. |
| 6,182,569 | B1 | 2/2001 | Rorke et al. |
| 6,207,077 | B1 | 3/2001 | Burnell-Jones |
| 6,284,435 | B1 | 9/2001 | Cao |
| 6,372,154 | B1 * | 4/2002 | Li .......................... 252/301.16 |
| 6,605,483 | B1 * | 8/2003 | Victor et al. ................... 438/22 |
| 2001/0003602 | A1 | 6/2001 | Fujita ......................... 427/64 |
| 2001/0010367 | A1 | 8/2001 | Burnell-Jones |
| 2001/0036538 | A1 | 11/2001 | Rozynov et al. |

FOREIGN PATENT DOCUMENTS

| | | | |
|---|---|---|---|
| WO | WO 00/04593 | * | 1/2000 |
| WO | WO 01/81012 | * | 11/2001 |

OTHER PUBLICATIONS

Mori et al., "Organic Light-Emitting Devices Patterned by Screen-Printing," *Jpn. J. Appl. Phys.* (2000 39:L942-L944).

Kalleder et al., "Nanometer sized particles for viscosity controlled binders for silk screen printing," *Journal of Non-Crystalline Solids*(1997) 218:399-402.

Chang et al., "Multicolor organic LEDs processed by integration of screen printing and thermal transfer printing," *Display Technologies III., Proceedings of SPIE* (2000) 4079:127-134.

Zhang et al., "Investigation of Using Contact and Non-contact Printing Technologies for Organic Transistor Fabrication," *Mat. Res. Soc. Symp. Proc.* (2002) 725:155-160.

* cited by examiner

SCREEN PRINTABLE ELECTROLUMINESCENT POLYMER INK

PRIORITY CLAIM

The present application claims priority benefit from U.S. Provisional Patent Application No. 60/342,580 filed Dec. 20, 2001 and entitled "Screen Printable Electroluminescent Polymer Ink", the contents of which are incorporated herein by reference.

FIELD OF THE INVENTION

The present invention relates to relates to the manufacturing method, namely screen printing, used to produce polymer light emitting devices. More specifically, this invention relates to electrically active polymer-containing compositions and their use in producing light emitting displays.

BACKGROUND OF THE INVENTION

Electroluminescent polymers are materials that emit light when sandwiched between two suitable electrodes and when a sufficient voltage is applied. A number of electroluminescent devices have been disclosed which use organic materials as an active light-emitting layer sandwiched between two electrodes. For example, U.S. Pat. No. 4,539,507 to VanSlyke et al. discloses a device having a bi-layer of two vacuum-sublimed films of small organic molecules sandwiched between two contacts. The small organic molecules however are not printable using a solution-based process. In a related patent, U.S. Pat. No. 5,247,190 to Friend et al. discloses a device having a thin dense polymer film made up of at least one conjugated polymer sandwiched between two electrodes. Additionally, U.S. Pat. No. 5,408,109 to Braun at al. shows that high brightness light emitting devices can be made using soluble electroluminescent polymers.

The results of these patents indicate that it might be possible to make light emitting displays using inexpensive solution-based atmospheric processing techniques, such as ink-jet printing, reel-to-reel or screen printing. However, obtaining efficient device operation requires the use of low work-function metals, such as Calcium, that are not stable under atmospheric processing (i.e. printing) conditions.

U.S. Pat. No. 5,682,043 to Pei et al. describes a polymer light-emitting electrochemical cell that contains a solid state electrolyte and salt that is used to electrochemically dope an organic electroluminescent layer, such as a conjugated polymer, via ionic transport. This system allows the ability to achieve efficient device operation without relying on the use of low work-function metals. Following this work, U.S. Pat. No. 6,284,435 to Yang Cao shows in that organic anionic surfactants cause a similar effect without needing ionic transport through the polymer film.

In theory, electrochemical doping or anionic surfactants could be used to make a electroluminescent polymer device that would be fully compatible with liquid-based processing under atmospheric conditions. Nonetheless, the electroluminescent polymer solutions and electrodes mentioned in these patents are not easy applicable to many fully liquid-based manufacturing process, such as screen printing.

Screen printing is one of the most promising methods to inexpensively manufacture large-area electroluminescent displays. Screen printing has been successfully applied to manufacturing large area inorganic phosphor-based electroluminescent displays, for example see U.S. Pat. No. 4,665,342 to by Topp et al. More recently, commonly owned U.S. patent application Ser. No. 09/844,703 to Victor et al. shows screen printing can also be used to manufacture polymer-based electroluminescent displays. This application describes a method to make a screen printable electroluminescent ink that substantially improves the screen printability and performance of electroluminescent polymer solutions through the use of soluble or dispersible additives, including transparent polymers, gel-retarders (i.e., viscous solvents), high boiling point solvents, oxide nanoparticles, and ionic dopants.

SUMMARY OF THE INVENTION

The addition of a variety of additives to a soluble electroluminescent polymer in solution is used to improve the printability and performance of screen printed light-emitting polymer-based devices. Examples of such additives include transparent and/or charge transporting polymers, gel-retarders, high viscosity liquids, organic and inorganic salts, and oxide nanoparticles. The additives are used to control the viscosity of the electroluminescent polymer ink, to decrease the solvent evaporation rate, and to improve the ink consistency and working time. In addition, these additives can improve the charge injection and power efficiency of light emitting devices manufactured from the screen printable electroluminescent polymer inks.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Figure 1:
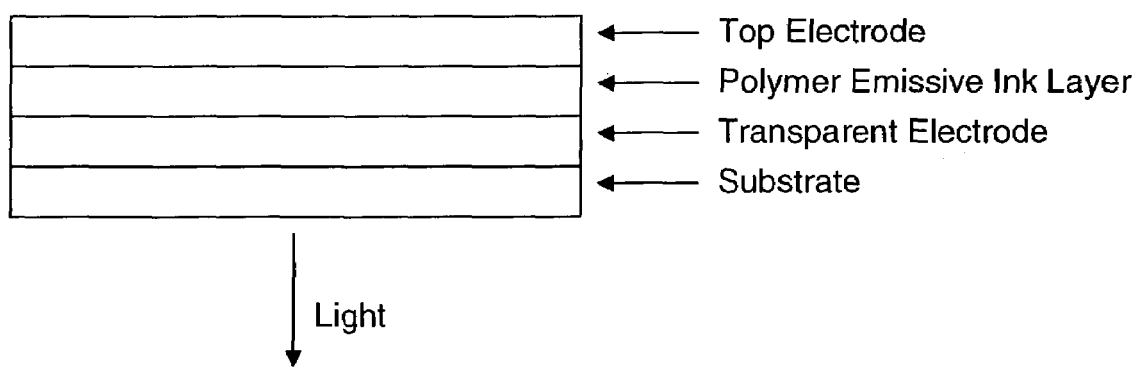
FIG. 1 is a diagram of a simplified polymer electroluminescent device.

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

In an embodiment of the present invention, an electroluminescent polymer ink that can be readily screen printed in a manufacturable process has been developed. For example, by adding transparent polymers (i.e., ones that do not significantly absorb the light emission from the light emitting polymer, or LEP, layer), gel-retarder (viscous solvent), and high-boiling point solvents to an electroluminescent polymer solution, control over ink viscosity, solvent evaporation rate, and print definition can be obtained to enable the ability to screen print uniform electroluminescent polymer films. Furthermore, the addition of electrochemical dopants, anionic surfactants, and oxide nanoparticles to the electroluminescent polymer solution can be used to further improve power efficiency and brightness in a electroluminescent device structure consisting of the screen printed electroluminescent polymer ink sandwiched between air stable electrodes. In this exemplary embodiment, these additions allow the formulation of a screen printable electroluminescent ink that can be used to make fully screen printed electroluminescent displays. These exemplary screen printed films are typically between about 100 nm and 1 micron thick.

Typically, an electroluminescent polymer solution is defined to include a soluble electroluminescent polymer material that is mixed at 0.3% to 5% by weight into solution with an appropriate solvent. An example of this would involve mixing 1% by weight of an electroluminescent polymer, such as MEH-PPV, into an organic solvent, such as p-xylene or chlorobenzene, to form the electroluminescent polymer solution. Another example of this would involve mixing an organic dye, such as rhodamme, into a charge transporting polymer, such as PVK, at a ratio of 1:20 (dye to polymer) and than mixing 1% by weight of this composite material into an organic solvent, such as p-xylene, to form the electroluminescent polymer solution. Another example is where the soluble electroluminescent organic material is a conjugated polymer.

A screen printable electroluminescent polymer ink according to an embodiment of the present invention includes a mixture of the electroluminescent polymer solution, as described above, with one or more additional non-emissive polymers. The additional non-emissive polymers can include: high-boiling point solvents; gel-retarders; electrochemical dopants; anionic surfactants; and oxide nanoparticles. As used herein, a conjugated polymer is a material with alternating single and double bonds between carbon atoms along the polymer backbone, and an organic chromophore is a material that emits light when excited. Examples of screen printable electroluminescent polymer inks according to the present invention, and the resulting device properties the are given below.

According to an embodiment of the present invention, high-boiling point organic solvents can be added to the electroluminescent polymer solution to decrease solvent evaporating rate. This additive improves the ability of the screen printed domains to flow together to produce a film of uniform thickness.

In one aspect of this embodiment, the organic solvent chosen should have a boiling point above about 130° C. Solvents with too high a boiling point lead to greater film non-uniformity and are more difficult to remove from the film after deposition. Therefore, solvents with a boiling point between about 120 and 200 degrees Celsius are desired, with about 130 degrees Celsius being preferred.

In another aspect of this embodiment, the organic solvent chosen should have minimal reactions with the electroluminescent polymer solution and other additives, and allow the electroluminescent polymer and any other additives to go into solution. Solvents having a solubility parameter in the region of $8.8–10.0\ (cal/cm^3)^{1/2}$, and preferably in the $9.4–9.9\ (cal/cm^3)^{1/2}$ range, satisfy these requirements. Examples of high-boiling point solvent additives that meet the criteria of this aspect of the present invention include, but are not limited to, chlorobenzene, p-xylene, diethylbenzene, and cyclohexanone.

In this embodiment of the present invention, the high-boiling point solvent is added to the electroluminescent polymer solution so that the electroluminescent polymer solution is between about 0.3% to 5% by weight of the total solution. According to this embodiment, the high-boiling point solvent is removed from the screen printed electroluminescent polymer film by heating, by applying a vacuum to the film, or by both heating and applying a vacuum.

According to another embodiment of the present invention, a gel-retarder, such as Coates Screen VPK Retarder Paste and Gel-100 Retarder Base, can be added to the electroluminescent polymer solution to decrease solvent evaporation as well as to improve ink stability and workability. Solvent evaporation that occurs too quickly can result in the screen mesh pattern being transferred to the substrate through improper coalescing of ink droplets. Fast evaporation can also cause the electroluminescent ink to dry in the screen, making multiple runs (without cleaning) difficult. In addition, the gel-retarder can be used to extend the working lifetime of the electroluminescent polymer ink and to decrease cob-webbing.

According to the present invention, the gel-retarder is chosen to have high viscosity, increasing the viscosity of the electroluminescent polymer solution as needed, yet remaining chemically inert in the electroluminescent polymer solution. The gel-retarder of this embodiment is added at a ratio of about 1% to 20% by weight of the solvent to the electroluminescent polymer ink, preferably, the minimum amount of gel-retarder is added to obtain printability. The addition of the gel-retarder is controlled to obtain a viscosity, preferably, of above about 50 centipoises.

The gel-retarder can be removed with the solvent from the electroluminescent polymer by heating, by applying a vacuum to the film, or by both heating and applying a vacuum. The polymer-based electroluminescent ink is screen printed using multiple passes to result in a dry film thickness between about 100 nm and 1 micron.

According to another embodiment of the present invention, non-electroluminescent polymer additives of various molecular weights can be added to the electroluminescent polymer solution to increase the viscosity of the polymer solution since typically electroluminescent polymer solutions have too low of a viscosity for effective screen printing. Solutions that have too low of viscosity can run, or bleed, through the screen, resulting in blurred edges, loss of patterning, and sticking between the screen and substrate. In this embodiment, the viscosity can be increased and controlled to improve printability through the use of polymer additives of various molecular weights.

The polymer additives of the present invention should meet several conditions: they should be soluble in a similar solvent as the electroluminescent polymer; they should be electrochemically inert in the chosen medium and operating conditions; they should have a certain electronic structure so that no significant charge transfer occurs from the electroluminescent polymer to the polymer additive (although charge transfer can occur from the polymer additive to the electroluminescent polymer); and they should have a sufficiently large band-gap so that the polymer additives do not significantly absorb the light emission from the electroluminescent polymer. Finally, the polymer additives should have a sufficiently high decomposition temperature so that they remain solid in the electroluminescent polymer film after the solvent is removed by heating or applying a vacuum to the film.

Acceptable polymer additives according to the criteria of this embodiment include, but are not limited to: aromatic polymers, such as polystyrene; poly(methyl methacrylates); and polymer electrolytes, such as polyethylene oxide (PEO). In the case of a PEO, the polymer electrolyte can also serve as an ion transporter for the ionic dopants. In another aspect of this embodiment, charge transporting polymers, such as polyvinylcarbozol, can be used to facilitate charge injection into the electroluminescent polymer.

In a typical solution of the present invention, the non-electroluminescent polymer with a molecular weight between about 300,000 and 20,000,000 will be added to the electroluminescent polymer solution at between about 2% to 100% by weight of the electroluminescent polymer depending on the relative solubility and molecular weights. The addition of the polymer is controlled to obtain a viscosity, preferably, of above about 50 centipoises.

The polymer-based electroluminescent ink is then screen printed using multiple passes to result in a dry film thickness between about 100 nm and 1 micron.

According to another embodiment of the present invention, ionic-dopants and surfactants can be added to the electroluminescent polymer solution, for example, similar to U.S. Pat. Nos. 5,682,043, 5,895,717 and 6,284,435, to increase the device efficiency and brightness in electroluminescent device structures that consist of air-stable electrodes. The ionic dopants and surfactants are chosen in this embodiment so that they do not cause significant irreversible electrochemical reactions under operating conditions, they enable efficient device operation (quantum efficiency above 0.5%) at low voltages (below 15V) with air stable contacts, they have reasonable switching speeds for the display application, they are stable to the solvent removal process, and they are stable to the encapsulation process. In this embodiment, the ionic dopants and surfactants are added in ratios of about 1% to 10% by weight of the ionic dopant and surfactant to the electroluminescent polymer solution. The surfactant can be an ionic surfactant. as discussed in the Background of the Invention section herein.

The ionic dopants of this embodiment include, but are not limited to, those having: a cation that is an ion of a metal, such as calcium, barium and aluminum; a cation that is a singly ionized alkali metal, such as lithium, sodium, potassium or cesium; an organic cation, such as tetrabutyl ammonium, tetraethyl ammonium, tetrapropyl ammonium, tetramethyl ammonium, and phenyl ammonium; an inorganic ion that includes singly inonized halogens, such as fluorine, chlorine, bromine and iodine; an inorganic anion such as sulfate, tetrafluoroborate, hexafluorophosphate, and aluminum tetrachlorate; and an organic anion, such a trifluormethane sulfonate, trifluroacetate, tetraphenylborate, and toluene sulfonate.

According to another embodiment of the present invention, oxide nanoparticles, such as silicon dioxide, can be added to the electroluminescent polymer solution to increase polymer viscosity and to improve device power efficiency and brightness. The oxide nanoparticles according to this embodiment are preferably chosen so that they are transparent, they are in the size range of between about 5 nm and 500 nm in diameter (depending on the desired thickness of the electroluminescent film), they readily disperse in the electroluminescent polymer solution, they do not detrimentally effect film morphology by inducing shorts, and they do not detrimentally affect device performance. Large oxide nanoparticle aggregates are removed by filtering. Suitable oxide nanoparticles for use in the present invention include, but are not limited to, silicon dioxide ($SiO_x$), titanium dioxide ($TiO_x$), zirconium dioxide ($ZrO_x$), or aluminum oxide ($Al_2O_{x+1}$), where $1.5<x<2.5$.

In this embodiment, the oxide nanoparticle is added at a ratio of about 5% to 70% by weight of the electroluminescent polymer solution. The addition of the oxide nanoparticle is controlled to obtain a viscosity, preferably, of above about 50 centipoises. The polymer-based electroluminescent ink is then screen printed using multiple passes to result in a dry film thickness between about 100 nm and 1 micron.

An example of the present invention in use is now provided, and consists of a fully screen printed device using a screen printed polymer electroluminescent ink. The screen printed ink of this example consists of 360 mg of MEH-PPV electroluminescent polymer, 120 mg of PEO with a molecular weight of 9,000,000, 40 mg of tetrabutylammonium-tetrafluoroborate ($C_{16}H_{36}BFN_4$), and 30 grams of chlorobenzene ($C_6H_5Cl$).

FIG. 1 illustrates the LEP devise of this example. As shown in FIG. 1, this exemplary device consists of four layers: substrate; transparent electrode; polymer emissive ink; and top electrode. The basic LEP construction is illustrated in commonly owned U.S. patent application Ser. No. 09/844,703, filed Apr. 27, 2001, entitled "Screen Printing Light-Emitting Polymer Pattern Devices", to Victor et al., the details of which will not be herein repeated.

The polymer emissive layer in this example of the present invention is printed through a 305 mesh pain-weave polyester cloth using 3 wet passes, a drying step, and an additional 3 wet passes. A commercially available screen printable silver conductive flake paste from Conductive Compounds is printed onto the LEP emissive layer through a 230 mesh plain-weave polyester cloth using 1 pass. After drying at 125° C. for 5 minutes, the silver conductive flake paste forms a highly conductive top electrode capable of supplying current to the LEP device over areas as large as several square inches, without hard shorts.

Figure 2:
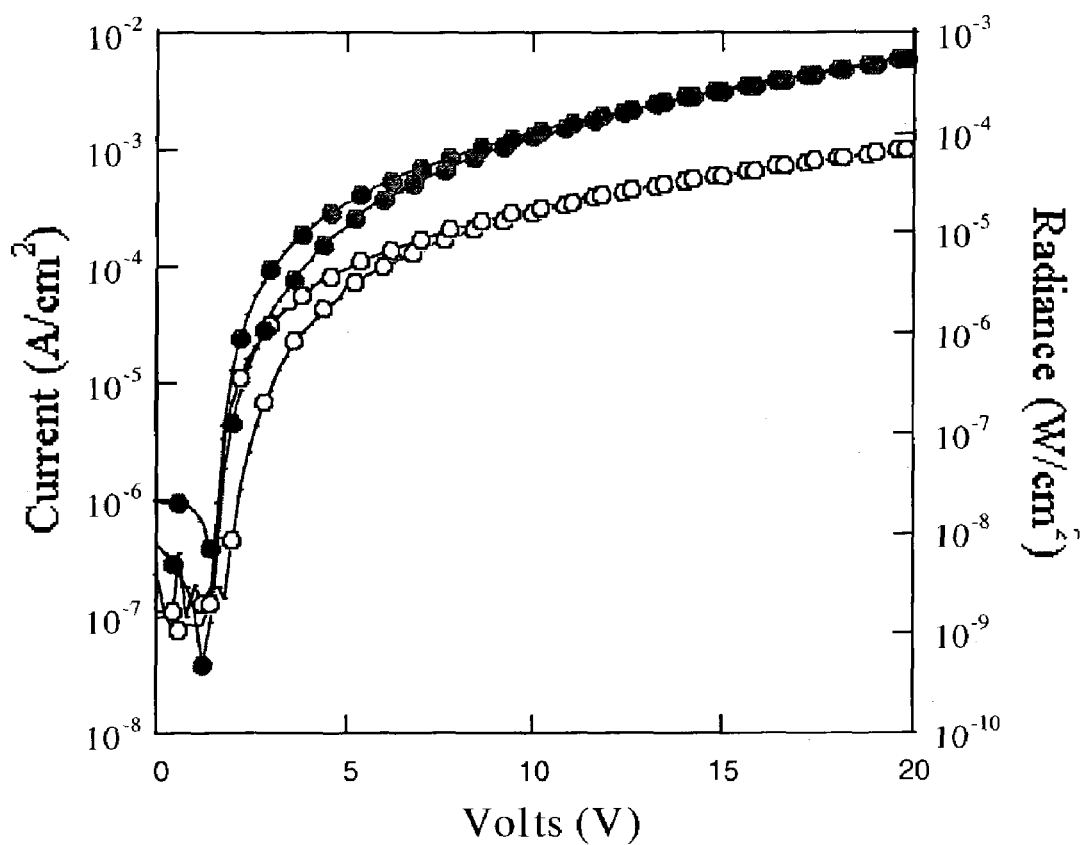
FIG. 2 shows the device performance of a fully screen printed light emitting polymer (LEP) device.

FIG. 2 illustrates the performance of the FIG. 1 device. As shown in FIG. 2, the solid-circle marked trace represents current density, whereas the hollow-circle marked trace represents radiance (i.e., light output).

Although the present invention has been particularly described with reference to the preferred embodiments thereof, it should be readily apparent to those of ordinary skill in the art that changes and modifications in the form and details thereof may be made without departing from the spirit and scope of the invention. For example, those skilled in the art will understand that variations can be made in the number and arrangement of components illustrated in the above block diagrams. It is intended that the appended claims include such changes and modifications.

What is claimed is:

1. A screen-printable light-emitting polymer-based ink, comprising:
   a soluble electroluminescent organic material;
   a first additive, the first additive being an organic solvent having a boiling point between about 120 and 200 degrees Celsius; and
   a second additive, the second additive being a viscosity enhancer added to maintain a viscosity of the ink above about 50 centipoises, wherein the viscosity enhancer is a gel-retarder.

2. The ink according to claim 1, wherein the gel-retarder is added to the soluble electroluminescent organic material at between about 1% and 20% by weight of the electroluminescent organic material.

3. The ink according to claim 1, wherein the soluble electroluminescent organic material is a conjugated polymer.

4. The ink according to claim 1, wherein the soluble electroluminescent organic material is an organic chromophore imbedded in a charge transporting polymer.

5. The ink according to claim 1, wherein the boiling point is about 130 degrees Celsius.

6. The ink according to claim 1, wherein the organic solvent is chlorobenzene, p-xylene, diethylbenzene, or cyclohexanone.

7. The ink according to claim 1, wherein the organic solvent is added to the soluble electroluminescent polymer material so that the electroluminescent polymer material is between about 0.3% and 5% by weight of the screen-printable light-emitting polymer-based ink.

8. The ink according to claim 1, further comprising a third additive, the third additive being an ionic dopant.

9. The ink according to claim 8, wherein the ionic dopant has an organic cation.

10. The ink according to claim 9, wherein the ionic dopant contains tetrabutyl ammonium, tetraethyl ammonium, tetrapropyl ammonium, tetramethyl ammonium, or phenyl ammonium.

11. The ink according to claim 8, wherein the ionic dopant has an inorganic anion.

12. The ink according to claim 11, wherein the ionic dopant contains sulfate, tetrafluoroborate, hexafluorophosphate or aluminum tetrachlorate.

13. The ink according to claim 8, wherein the ionic dopant has an organic anion.

14. The ink according to claim 13, wherein the ionic dopant is trifluormethane sulfonate, trifluroacetate, tetraphenylborate, or toluene sulfonate.

15. The ink according to claim 8, wherein the ionic dopant is added to the soluble electroluminescent organic material at between about 1% and 10% by weight of the electroluminescent organic material.

16. The ink according to claim 1, further comprising a third additive, the third additive being an ionic surfactant.

17. The ink according to claim 16, wherein the ionic surfactant is added to the soluble electroluminescent organic material at between about 1% and 10% by weight of the electroluminescent organic material.

* * * * *